(12) United States Patent
Matsumura

(10) Patent No.: US 11,490,518 B2
(45) Date of Patent: Nov. 1, 2022

(54) WIRING BOARD

(71) Applicant: Ricoh Company, Ltd., Tokyo (JP)

(72) Inventor: Kyohei Matsumura, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 16/929,375

(22) Filed: Jul. 15, 2020

(65) Prior Publication Data
US 2021/0120673 A1 Apr. 22, 2021

(30) Foreign Application Priority Data

Oct. 18, 2019 (JP) .............................. JP2019-191343

(51) Int. Cl.
*H05K 1/18* (2006.01)
*H05K 1/03* (2006.01)
(52) U.S. Cl.
CPC ............ *H05K 1/181* (2013.01); *H05K 1/0353* (2013.01); *H05K 1/0386* (2013.01); *H05K 2201/10015* (2013.01)
(58) Field of Classification Search
CPC ........ H05K 1/18; H05K 1/181; H05K 1/0353; H05K 1/0386; H05K 2201/10015
USPC ......................................................... 361/782
See application file for complete search history.

(56) References Cited

U.S. PATENT DOCUMENTS

| 6,992,374 B1 | 1/2006 | Yang et al. |
| 2018/0138884 A1* | 5/2018 | Kauffman ............ H03H 7/0138 |
| 2021/0119335 A1* | 4/2021 | Mizuno .................. H01Q 21/30 |

FOREIGN PATENT DOCUMENTS

| JP | 2008-277361 | 11/2008 |
| JP | 2010-045085 | 2/2010 |
| JP | 2014-207531 A | 10/2014 |
| JP | 2018-049955 | 3/2018 |
| JP | 2018-149759 | 9/2018 |

OTHER PUBLICATIONS

Machine translation of Kitagawa et al. (Japanese Patent Publication No. 2010-045085), Feb. 25, 2010 (Year: 2010).*
Extended European Search Report dated Mar. 1, 2021 in European Patent Application No. 20198438.2, 9 pages.
G. Vogel, "Avoiding flex cracks in ceramic capacitors: Analytical tool for a reliable failure analysis and guideline for positioning cercaps on PCBs," Microelectronics Reliability, vol. 55, XP029294608, 2015, pp. 2159-2164.

* cited by examiner

*Primary Examiner* — Tremesha S Willis
(74) *Attorney, Agent, or Firm* — Xsensus LLP

(57) ABSTRACT

A wiring board includes a substrate and a plurality of monolithic ceramic capacitors connected in series on the substrate. The plurality of monolithic ceramic capacitors includes a first monolithic ceramic capacitor oriented in a first direction and a second monolithic ceramic capacitor oriented in a second direction. The second direction is at an angle of 45±5 degrees relative to the first direction.

6 Claims, 5 Drawing Sheets

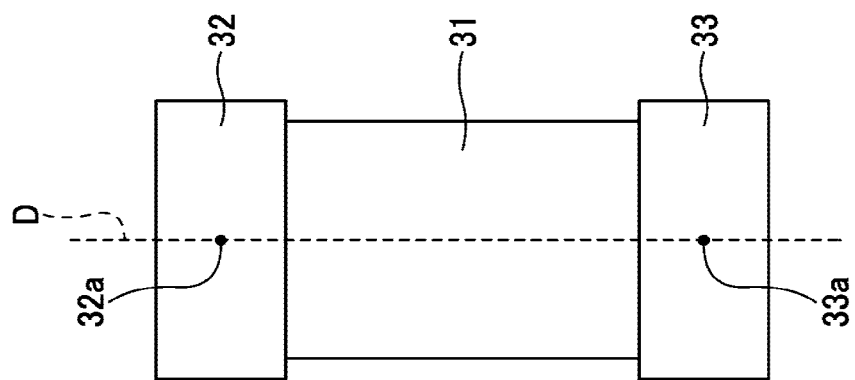
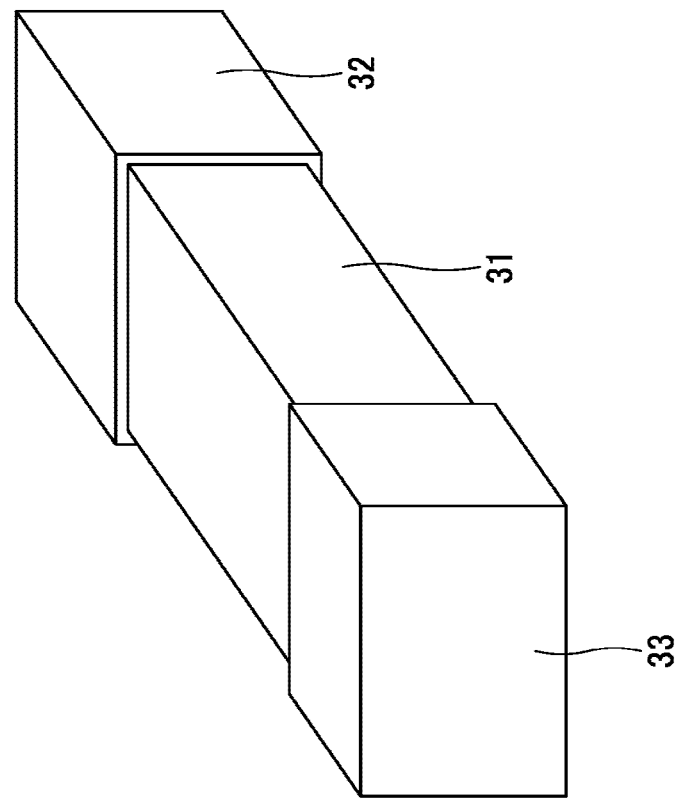

WIRING BOARD

CROSS-REFERENCE TO RELATED APPLICATION

This patent application is based on and claims priority pursuant to 35 U.S.C. § 119(a) to Japanese Patent Application No. 2019-191343, filed on Oct. 18, 2019, in the Japan Patent Office, the entire disclosure of which is hereby incorporated by reference herein.

BACKGROUND

Technical Field

The present disclosure relates to a wiring board.

Related Art

A capacitor is one of electronic components mounted on a wiring board. Examples of capacitors include ceramic capacitors, tantalum capacitors, and aluminum electrolytic capacitors. Since a plurality of capacitors are usually used on one wiring board, various ingenuities have been tried for the arrangement of the capacitors.

SUMMARY

According to an embodiment of this disclosure, a wiring board includes a substrate and a plurality of monolithic ceramic capacitors connected in series on the substrate. The plurality of monolithic ceramic capacitors includes a first monolithic ceramic capacitor oriented in a first direction and a second monolithic ceramic capacitor oriented in a second direction. The second direction is at an angle of 45±5 degrees relative to the first direction.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIGS. 4A and 4B are views illustrating an appearance of a capacitor;

Figure 1:
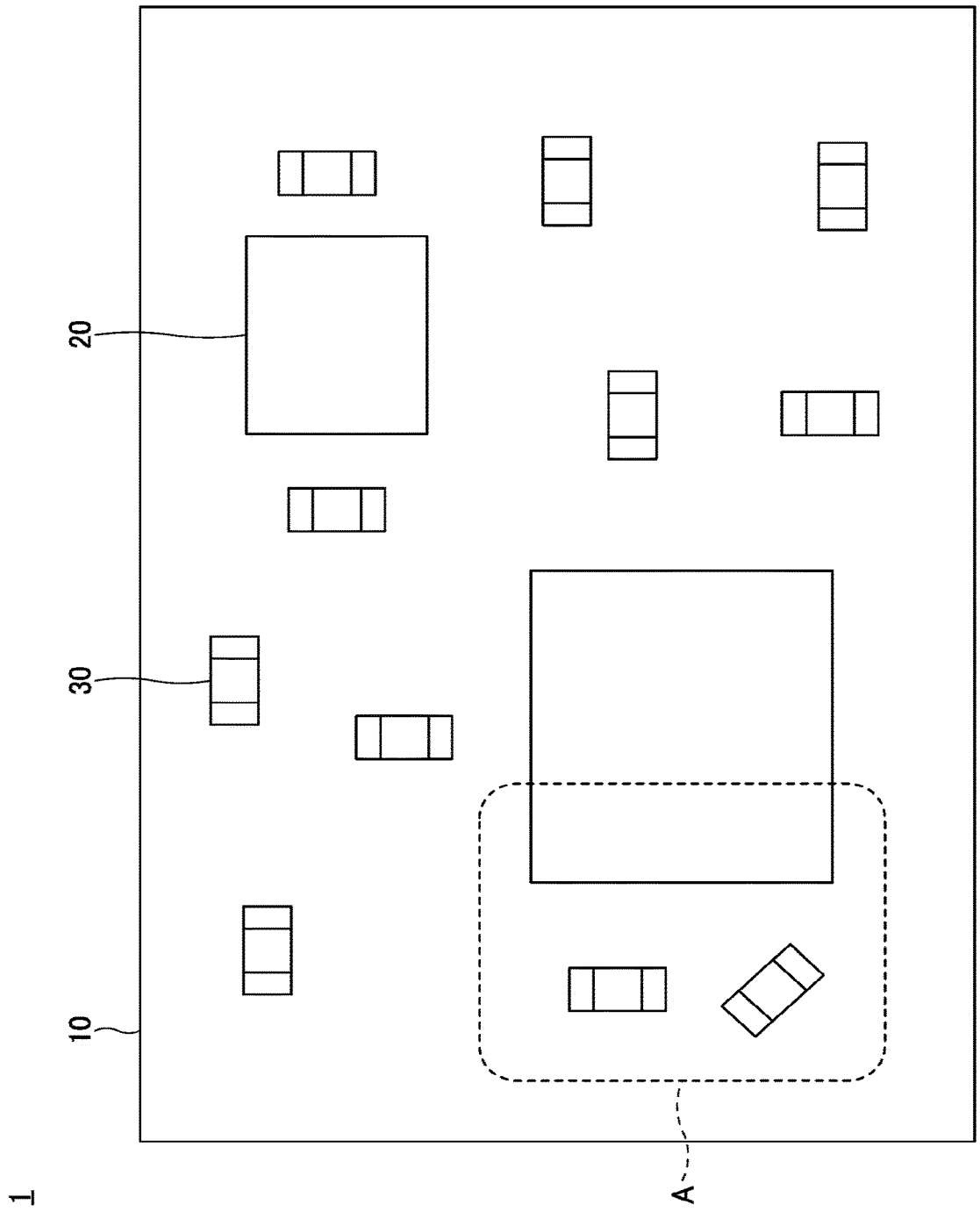
FIG. 1 is a plan view illustrating a wiring board according to an embodiment of the present disclosure.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected, and it is to be understood that each specific element includes all technical equivalents that have the same function, operate in a similar manner, and achieve a similar result.

Referring now to the drawings, wherein like reference numerals designate identical or corresponding parts throughout the several views thereof, embodiments of this disclosure are described. As used herein, the singular forms "a," "an," and "the" are intended to include the plural forms as well, unless the context clearly indicates otherwise.

Referring to FIG. 1, a wiring board 1 includes a substrate 10, an active component 20, and a passive component 30.

The active component 20 and the passive component 30 are mounted on one side of the substrate 10. However, another active component 20 and another passive component 30 can be mounted also on the other side of the substrate 10 as double-sided mounting.

Terminals of the active component 20 and the passive component 30 are connected to a component mounting land on the substrate 10 by soldering or the like. The substrate 10 is mounted with a wiring pattern for connecting together required portions of the terminals of the active component 20 and the passive component 30, a power supply wiring (VDD wiring) pattern connected to the active component 20, and a ground wiring (GND wiring) pattern.

The substrate 10 is not particularly limited, but is, for example, a resin substrate (a glass epoxy substrate, a phenolic paper substrate, etc.), a ceramic substrate, a silicon substrate, or the like. The substrate 10 can be any one of a single-sided substrate having a wiring pattern on one side, a double-sided substrate having wiring patterns on both sides, and a multi-layer substrate in which a plurality of wiring patterns are laminated via insulation layers.

The active component 20 is not particularly limited, but is, for example, a semiconductor integrated circuit, a transistor, a diode, or the like. The passive component 30 is not particularly limited, but is, for example, a capacitor, a resistor, an inductor, a connector, or the like.

Figure 2:
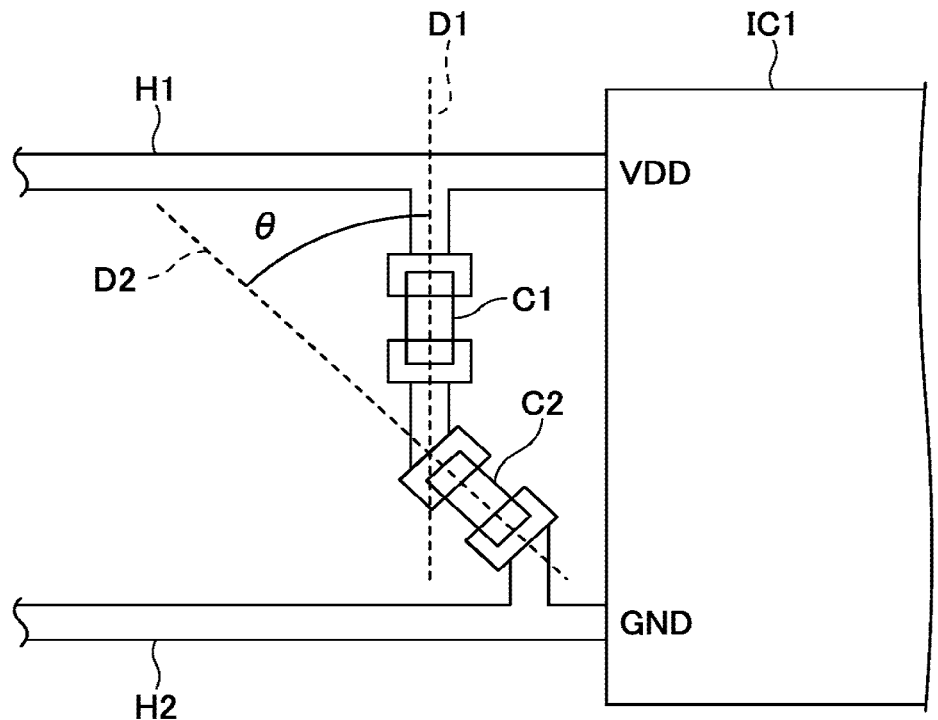
FIG. 2 is an enlarged view of a portion of the wiring board in FIG. 1.
Figure 3:
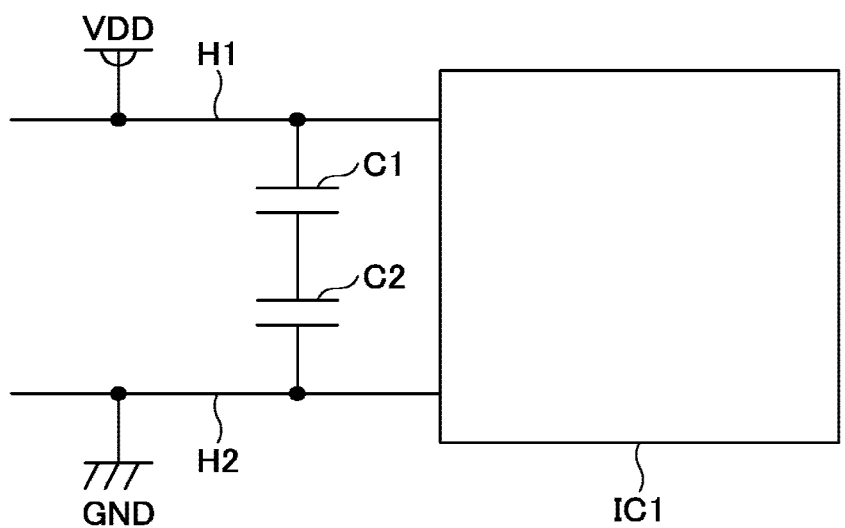
FIG. 3 is a circuit diagram corresponding to FIG. 2.

FIG. 2 is an enlarged view of a portion A in FIG. 1 and illustrates an arrangement of capacitors according to the present embodiment. FIG. 3 is a circuit diagram corresponding to FIG. 2. Referring to FIGS. 2 and 3, supply voltage (VDD) wiring H1 having a power supply potential and ground (GND) wiring H2 having a ground potential are connected to an integrated circuit (IC) IC1. Between the supply voltage wiring H1 and the ground wiring H2, capacitors C1 and C2 (also collectively "capacitors C"), which are bypass capacitors, are connected in series.

The IC IC1 is a semiconductor integrated circuit, and the capacitors C1 and C2 are monolithic ceramic capacitors. The IC IC1 is a part of the active component 20 illustrated in FIG. 1. The capacitors C1 and C2 are a part of the passive component 30 illustrated in FIG. 1.

FIGS. 4A and 4B are views illustrating an external appearance of each of the capacitors. FIG. 4A is a perspective view, and FIG. 4B is a plan view. As illustrated in FIGS. 4A and 4B, each of the capacitors C1 and C2 has a substantially rectangular parallelepiped body 31, and electrodes 32 and 33 on opposite sides of the body 31 from each other. The body 31 is, for example, a dielectric made of barium titanate or the like. The electrodes 32 and 33 are electric conductors and are made of, for example, copper plated with tin.

In the present embodiment, as illustrated in FIG. 4B, in a plan view, a direction indicated by a broken line D in FIG. 4B, in which a center 32a of the electrode 32 is connected with a center 33a of the electrode 33, is referred to as a mounting direction D of the capacitor C1 or C2.

Returning to the description of FIG. 2, the broken line D1 indicates the mounting direction of the capacitor C1, that is, an orientation of the capacitor C1 on the substrate 10 (hereinafter also "mounting direction D1"). In other words, the capacitor C1 is mounted in the direction indicated by the broken line D1 on the substrate 10. A broken line D2 indicates the mounting direction of the capacitor C2 on the substrate 10 (hereinafter also "mounting direction D2"). In other words, the capacitor C2 is mounted in the direction indicated by the broken line D2 on the substrate 10. In the capacitor arrangement illustrated in FIG. 2, an angle θ between the mounting direction D1 and the mounting direction D2 is 45±5 degrees. An advantage thereof is described below.

It is possible that various stresses are applied to the wiring board 1. Depending on the direction of the stress, a component mounted on the wiring board 1 may be cracked, resulting in a short circuit.

Since a monolithic ceramic capacitor is a capacitor type in which a crack causes a short circuit, a technique being considered is connecting a plurality of monolithic ceramic capacitors in series between different direct current (DC) potentials. In such an arrangement, even when a short circuit occurs in one of the monolithic ceramic capacitors, insulation will be maintained by other serially connected monolithic ceramic capacitors. However, the plurality of monolithic ceramic capacitors connected in series is usually mounted at a short distance from each other on the wiring board. Therefore, when stress is applied to the wiring board, the same stress is applied to each monolithic ceramic capacitor, and all the monolithic ceramic capacitors may be cracked.

For example, when a short circuit occurs in the capacitors C1 and C2 in the circuit illustrated in FIG. 3, a short circuit may occur between the supply voltage and the ground, and a large current may flow.

Therefore, the inventors have studied the relationship between the direction in which stress is applied to a monolithic ceramic capacitor and the possibility of occurrence of a crack in the monolithic ceramic capacitor. Hereinafter, unless otherwise specified, the term "capacitor" refers to a monolithic ceramic capacitor.

Figure 5C:
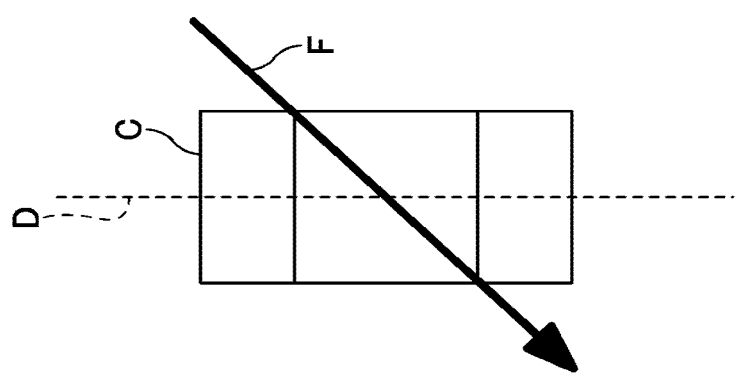
FIGS. 5A, 5B, and 5C illustrate relationships between a direction of stress and the possibility of occurrence of a crack in a capacitor.
Figure 5B:
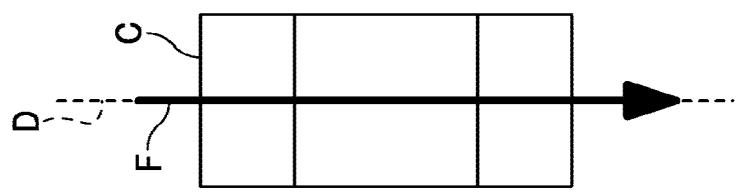
Figure 5A:
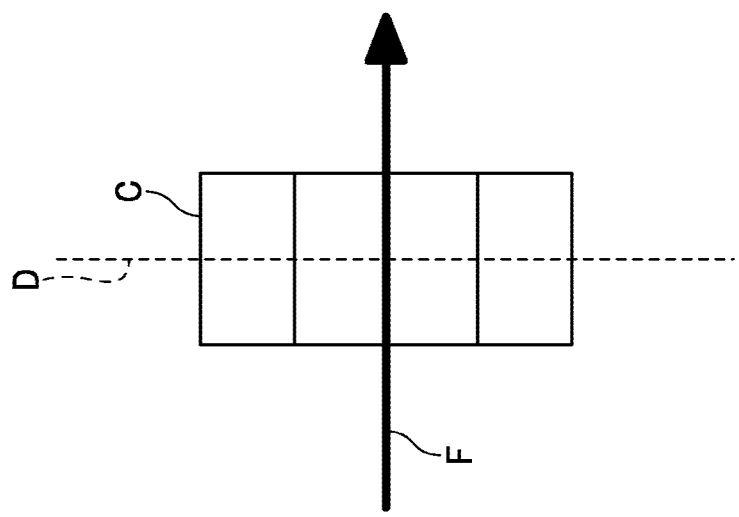

According to the studies by the inventors, the possibility of occurrence of a crack is relatively low in a case where the angle of a stress F is 90 degrees (perpendicular) to the mounting direction D of the capacitor C as illustrated in FIG. 5A and a case where the angle of the stress F is 0 degree (parallel) to the mounting direction D of the capacitor C as illustrated in FIG. 5B.

By contrast, when the angle of the stress F is 45 degrees to the mounting direction D of the capacitor C as illustrated in FIG. 5C, the possibility of occurrence of a crack is higher compared with the cases illustrated in FIGS. 5A and 5B.

Figure 6A:
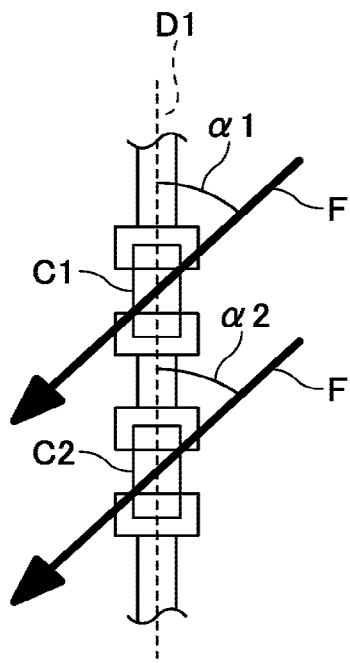
FIGS. 6A to 6D illustrate an effect of a capacitor arrangement according to an embodiment of the present disclosure.
Figure 6B:
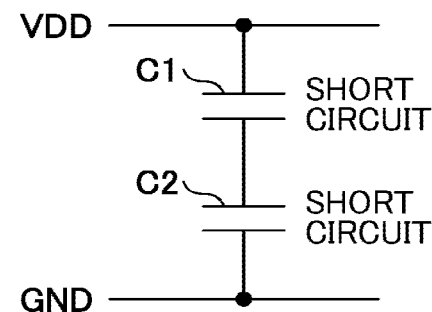

From this result, as illustrated in FIG. 6A, in the arrangement in which the mounting directions D1 and D2 of the capacitors C1 and C2 are the same, it is possible that each of the capacitors C1 and C2 receives the stress F at an angle α1 or α2 of about 45 degrees relative to the mounting directions D1 and D2. In this case, as illustrated in FIG. 6B, the capacitors C1 and C2 may be cracked, resulting a short circuit. There is a risk that a short circuit occurs between the supply voltage and the ground, and a large current flows.

Figure 6C:
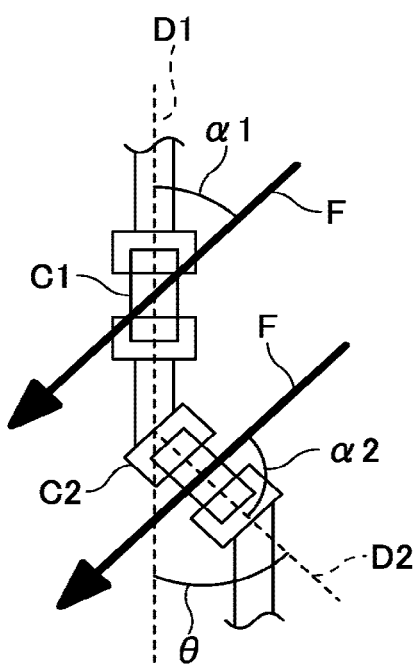
Figure 6D:
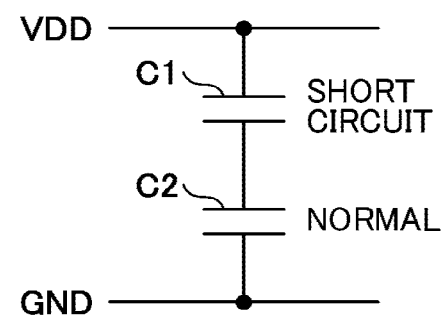

On the other hand, in FIG. 6C, the mounting direction D1 of the capacitor C1 is deviated by the angle θ of 45 degrees from the mounting direction D2 of the capacitor C2. In this arrangement, when a stress at the angle α1 of 45 degrees relative to the mounting direction D1 is applied to the capacitor C1, the angle α2, relative to the mounting direction D2, of the stress applied to the capacitor C2 is 90 degrees. As described above with reference to FIGS. 5A to 5C, when the angle α2 is 0 degrees or 90 degrees, the possibility of the occurrence of a crack by the same stress F is low. As a result, even when the capacitor C1 is cracked and a short circuit occurs, the capacitor C2 is not cracked and continues to operate normally as illustrated in FIG. 6D. Therefore, this arrangement can reduce the risk of the short circuit between the supply voltage and the ground and a flow of large current.

According to the consideration made by the inventors, when the angle θ between the mounting direction D1 and the mounting direction D2 is 45±5 degrees, the above effect can be obtained to the same extent as in the case where the angle θ is 45 degrees.

As described above, in the capacitor arrangement according to the present embodiment, the capacitor C1 is mounted in the mounting direction D1 (oriented in a first direction), and the capacitor C2 is mounted in the mounting direction D2 (oriented in a second direction) that is at an angle of 45±5 degrees relative to the mounting direction D1.

With this arrangement, the direction (relative to the mounting direction) of the applied stress differs between the capacitors C1 and C2. This arrangement can prevent application of stress in the same direction to each of the capacitors and prevent a resultant crack in each of the capacitors to cause a short circuit.

The stress occurs, for example, when another connector is inserted into or removed from the connector mounted on the substrate 10. Alternatively, a stress may occur when an operator pushes the wiring board 1 with a finger during the manufacturing of the wiring board 1 or after the wiring board 1 is manufactured.

The stress generated at this time is more easily transmitted to the capacitors C1 and C2 as the rigidity of the substrate used decreases. Therefore, the lower the rigidity of the substrate 10 is, the greater the technical significance of setting the angle between the mounting directions D1 and D2 to 45±5 degrees, to prevent the occurrence of cracks in the capacitors C1 and C2.

That is, the technical significance of setting the angle between the mounting direction D1 and the mounting direction D2 to 45±5 degrees and preventing the occurrence of cracks in the capacitors C1 and C2 is greater in a case where a resin substrate is used for the substrate 10, compared with a case where a ceramic substrate or a silicon substrate is used. In particular, when a phenolic paper substrate having a low rigidity among resin substrates is used as the substrate 10, a greater technical significance is attained by setting the angle between the mounting directions D1 and D2 to 45±5 degrees, to prevent the occurrence of cracks in the capacitors C1 and C2.

The above description concerns the example where two capacitors are connected in series between different DC potentials. However, even when three or more capacitors are connected in series between different DC potentials, the same effect as above can be obtained by shifting the mounting direction of at least two capacitors by 45±5 degrees.

Further, the different DC potentials are not limited to the power supply potential and the ground potential. For example, the different DC potentials can be a potential divided from the power supply potential and the ground potential. Further, when there is a positive power supply potential and a negative power supply potential relative to the ground potential, the capacitor arrangement according to the present embodiment can be applied to both between the positive power supply potential and the ground potential and between the negative power supply potential and the ground potential.

Further, the capacitor arrangement according to the present embodiment is applicable to, not only to the capacitors between different DC potentials, a plurality of capacitors connected in series between any two wires, regardless of direct current or alternating current. In this case, the capacitor arrangement described above can prevent the inconvenience that all capacitors are cracked and a short circuit in each capacitor occurs at the same time, causing a short circuit between the wires.

The above-described embodiments are illustrative and do not limit the present disclosure. Thus, numerous additional modifications and variations are possible in light of the above teachings. For example, elements and/or features of different illustrative embodiments may be combined with each other and/or substituted for each other within the scope of the present disclosure.

What is claimed is:

1. A wiring board comprising:
   a substrate;
   a plurality of monolithic ceramic capacitors connected in series on the substrate and including:
     a first monolithic ceramic capacitor oriented in a first direction; and
     a second monolithic ceramic capacitor oriented in a second direction at an angle of 45±5 degrees relative to the first direction,
   wherein the substrate is a resin substrate, and
   the substrate is a multi-layer laminated structure including a plurality of layers of wiring patterns separated by insulation layers, and at least one of the wiring patterns connects together terminals of the plurality of monolithic ceramic capacitors in series.

2. The wiring board according to claim 1, wherein the plurality of monolithic ceramic capacitors is connected in series between two different direct current potentials.

3. The wiring board according to claim 2,
   further comprising a semiconductor integrated circuit mounted on the substrate,
   wherein one of the different direct current potentials is a power supply potential connected to the semiconductor integrated circuit, and the other of the different direct current potentials is a ground potential connected to the semiconductor integrated circuit.

4. The wiring board according to claim 1, wherein the substrate is a phenolic paper substrate.

5. The wiring board of claim 1, wherein the plurality of monolithic ceramic capacitors is connected in series between two different wires carrying alternating current.

6. A wiring board comprising:
   a substrate;
   a plurality of monolithic ceramic capacitors connected in series on the substrate and including:
     a first monolithic ceramic capacitor oriented in a first direction; and
     a second monolithic ceramic capacitor oriented in a second direction at an angle of 45±5 degrees relative to the first direction,
   wherein the substrate is a resin substrate,
   the plurality of monolithic ceramic capacitors includes three or more monolithic ceramic capacitors connected in series, and
   the substrate is a multi-layer laminated structure including a plurality of layers of wiring patterns separated by insulation layers, and at least one of the wiring patterns connects together terminals of the plurality of monolithic ceramic capacitors in series.

* * * * *